US012787155B2

(12) United States Patent
Murase

(10) Patent No.: US 12,787,155 B2
(45) Date of Patent: Nov. 3, 2026

(54) HIGH FREQUENCY MODULE AND COMMUNICATION APPARATUS

(71) Applicant: Murata Manufacturing Co., Ltd., Kyoto (JP)

(72) Inventor: Hisanori Murase, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 203 days.

(21) Appl. No.: 18/895,830

(22) Filed: Sep. 25, 2024

(65) Prior Publication Data

US 2025/0212318 A1 Jun. 26, 2025

(30) Foreign Application Priority Data

Dec. 20, 2023 (JP) ................................ 2023-215123

(51) Int. Cl.

| | |
|---|---|
| ***H05K 1/11*** | (2006.01) |
| ***H04B 1/00*** | (2006.01) |
| ***H04B 1/04*** | (2006.01) |
| ***H05K 1/02*** | (2006.01) |

(52) U.S. Cl.

CPC ........... *H05K 1/0243* (2013.01); *H04B 1/006* (2013.01); *H04B 1/0475* (2013.01); *H05K 1/115* (2013.01); *H04B 2001/0416* (2013.01)

(58) Field of Classification Search

CPC ...... H05K 1/0243; H05K 1/115; H04B 1/006; H04B 1/0475; H04B 2001/0416

USPC ........................................................ 361/783

See application file for complete search history.

(56) References Cited

U.S. PATENT DOCUMENTS

2021/0021024 A1* 1/2021 Park .................... H01Q 1/2283

FOREIGN PATENT DOCUMENTS

JP 2005-217581 A 8/2005

* cited by examiner

*Primary Examiner* — Binh B Tran

(74) *Attorney, Agent, or Firm* — McDonald Hopkins LLC

(57) ABSTRACT

A high frequency module includes a mounting substrate and an IC chip. The IC chip includes a plurality of switches and a plurality of low noise amplifiers. The mounting substrate includes a first ground layer, a second ground layer, a first via conductor group, and a second via conductor group. The first ground layer has a plurality of slits. The plurality of slits include a first slit and a second slit. The first slit is arranged between a first via conductor and a third via conductor in a plan view from a thickness direction of a mounting substrate. The second slit is arranged between a second via conductor and a fourth via conductor in a plan view from the thickness direction of the mounting substrate.

17 Claims, 11 Drawing Sheets

HIGH FREQUENCY MODULE AND COMMUNICATION APPARATUS

CROSS REFERENCE TO RELATED APPLICATION

This application claims priority from Japanese Patent Application No. 2023-215123 filed on Dec. 20, 2023. The content of this application is incorporated herein by reference in its entirety.

BACKGROUND ART

The present disclosure relates to a high frequency module and a communication apparatus, and more particularly, to a high frequency module that includes an IC chip including a low noise amplifier and a communication apparatus that includes the high frequency module.

In Japanese Unexamined Patent Application Publication No. 2005-217581, a high frequency module that includes a semiconductor element (IC chip) including a transmission power amplifier (power amplifier) is described. In the high frequency module described in Japanese Unexamined Patent Application Publication No. 2005-217581, an interference preventing ground pattern is arranged between two voltage supply lines through which voltage is supplied to a transmission power amplifier. Furthermore, in the high frequency module described in Japanese Unexamined Patent Application Publication No. 2005-217581, in the interference preventing ground pattern, a slit is provided between two regions that are opposite the two voltage supply lines.

BRIEF SUMMARY

In the high frequency module described in Japanese Unexamined Patent Application Publication No. 2005-217581, in the case where the IC chip includes a low noise amplifier, signal interference may occur not only between the voltage supply lines but also between paths for reception signals.

The present disclosure reduces signal interference in a high frequency module that includes an IC chip including a low noise amplifier and a communication apparatus that includes the high frequency module.

A high frequency module according to an aspect of the present disclosure includes a mounting substrate and an IC chip. The mounting substrate is a multilayer substrate and has a first main surface and a second main surface that are opposite each other. The IC chip is disposed on the first main surface of the mounting substrate. The IC chip includes a plurality of switches and a plurality of low noise amplifiers. The plurality of low noise amplifiers are connected to the plurality of switches on a one-to-one basis. The plurality of switches include a first switch and a second switch. The plurality of low noise amplifiers include a first low noise amplifier and a second low noise amplifier. The first low noise amplifier is connected to the first switch. The second low noise amplifier is connected to the second switch. The mounting substrate includes a first ground layer, a second ground layer, a first via conductor group, a second via conductor group, and a third via conductor group. The first ground layer is disposed between the first main surface and the second main surface. The second ground layer is disposed between the first ground layer and the second main surface. The first via conductor group connects the plurality of switches to the first ground layer. The second via conductor group connects the plurality of low noise amplifiers to the first ground layer. The third via conductor group connects the first ground layer to the second ground layer. The first ground layer has a plurality of slits. The third via conductor group is disposed around the first via conductor group and the second via conductor group in a plan view from a thickness direction of the mounting substrate. The first via conductor group includes a first via conductor and a second via conductor. The first via conductor is connected to the first switch. The second via conductor is connected to the second switch. The second via conductor group includes a third via conductor and a fourth via conductor. The third via conductor is connected to the first low noise amplifier. The fourth via conductor is connected to the second low noise amplifier. The plurality of slits include a first slit and a second slit. The first slit is arranged between the first via conductor and the third via conductor in a plan view from the thickness direction of the mounting substrate. The second slit is arranged between the second via conductor and the fourth via conductor in a plan view from the thickness direction of the mounting substrate. A combination of the first via conductor, the first slit, and the third via conductor and a combination of the second via conductor, the second slit, and the fourth via conductor are arranged adjacent to each other.

A communication apparatus according to an aspect of the present disclosure includes the high frequency module, and a signal processing circuit that is connected to the high frequency module.

With a high frequency module and a communication apparatus according to aspects of the present disclosure, signal interference can be reduced.

DETAILED DESCRIPTION

Figure 1:
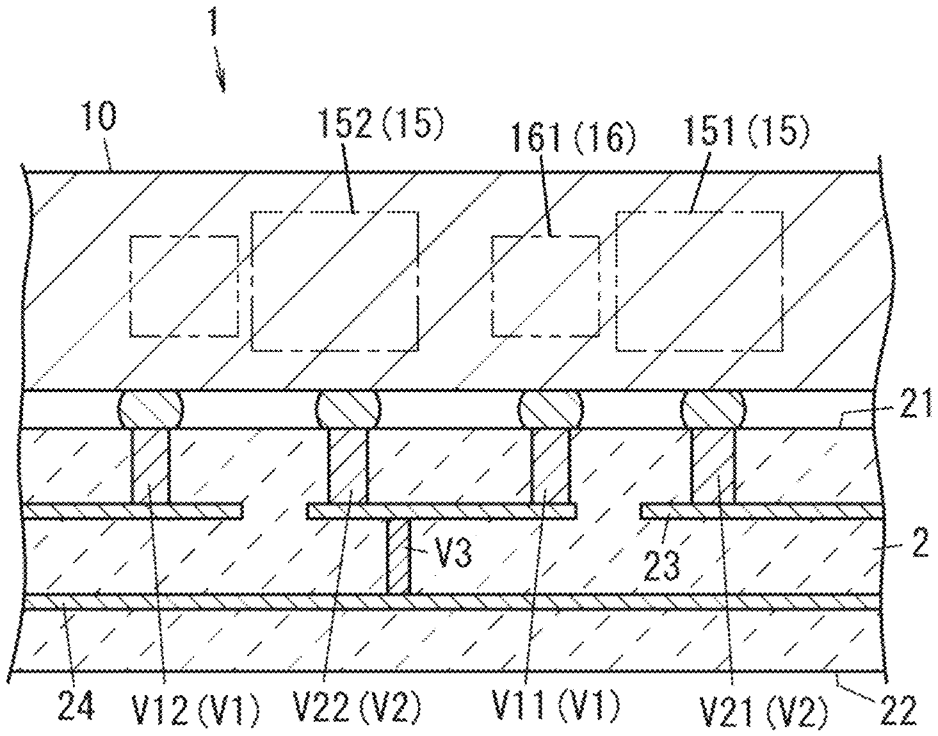
FIG. 1 is a cross-section view of a main part of a high frequency module according to a first embodiment.

Hereinafter, a high frequency module and a communication s according to embodiments will be described with reference to drawings. The drawings referenced in the embodiments described below are schematic diagrams. Ratios of sizes and thicknesses of component elements in the drawings do not necessarily reflect the actual dimensional ratios.

First Embodiment (1) High Frequency Module

Figure 7:
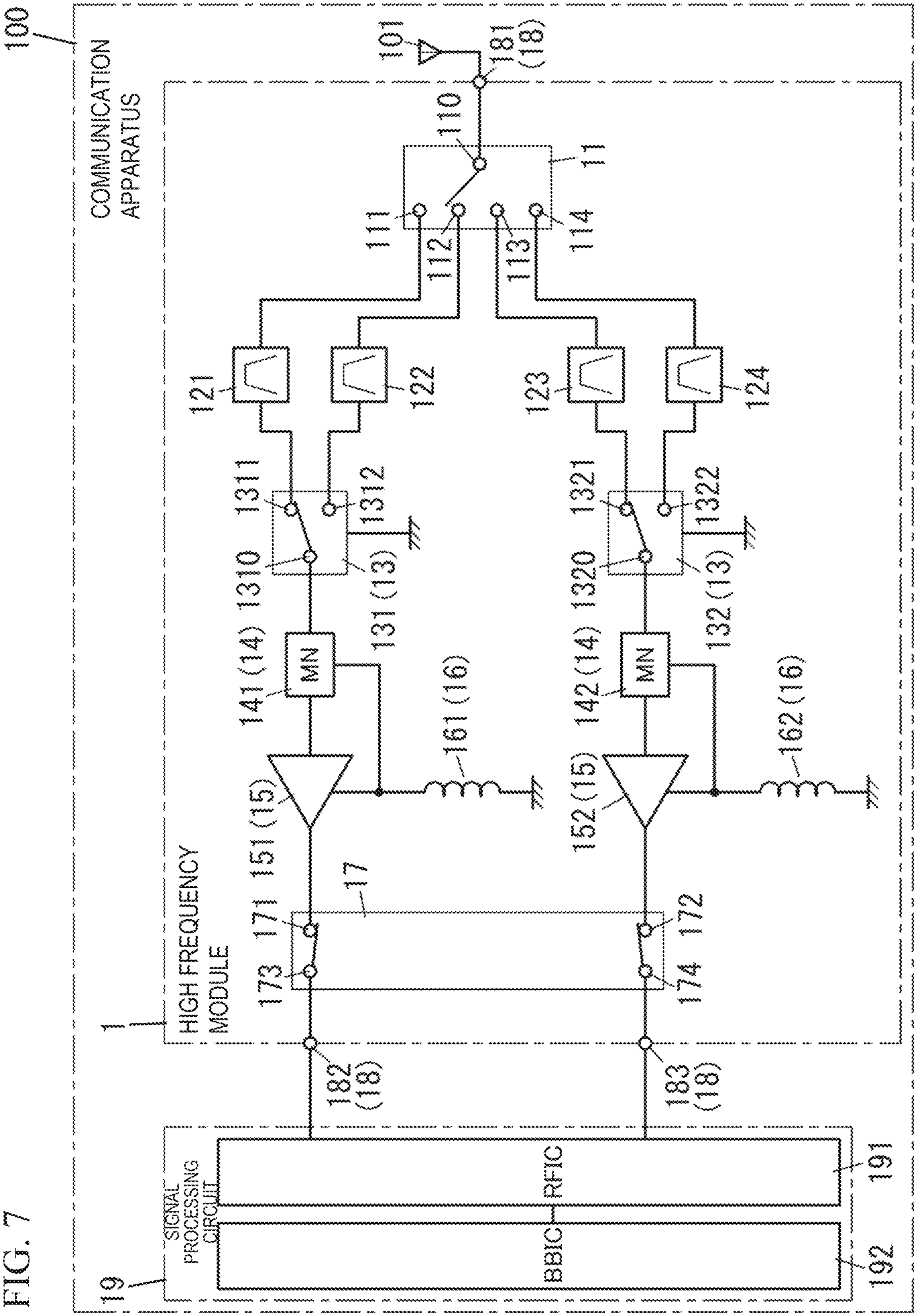
FIG. 7 is a circuit configuration diagram of a communication apparatus including the high frequency module.

A high frequency module 1 is, for example, used in a communication apparatus 100, as illustrated in FIG. 7. The communication apparatus 100 is, for example, a cellular phone such as a smartphone. The communication apparatus 100 is not limited to a cellular phone and may be, for example, a wearable terminal such as a smartwatch. The high frequency module 1 is, for example, a high frequency module capable of supporting fourth generation mobile communications (4G) standards, fifth generation mobile communications (5G) standards, and the like. The 4G standards are, for example, Third Generation Partnership Project (3GPP, registered trademark) Long Term Evolution (LTE, registered trademark) standards. The 5G standards are, for example, 5G New Radio (NR). For example, the high frequency module 1 is capable of supporting carrier aggregation and dual connectivity.

For example, the high frequency module 1 is provided in the communication apparatus 100 supporting multiple bands conforming to communication standards such as LTE. For example, the high frequency module 1 allocates different frequencies to transmission signals (transmission high frequency signals) and reception signals (reception high frequency signals) by frequency division duplex (FDD) and thus implements bidirectional transmission of full-duplex communication.

(2) Circuit Configuration of High Frequency Module

A circuit configuration of the high frequency module 1 according to the first embodiment will be described below with reference to FIG. 7.

As illustrated in FIG. 7, the high frequency module 1 according to the first embodiment includes, for example, a plurality of external connection terminals 18, a switch 11, a plurality of (four in FIG. 7) reception filters 121 to 124, a plurality of (two in FIG. 7) switches 13, a plurality of (two in FIG. 7) matching circuits 14, a plurality of (two in FIG. 7) low noise amplifiers 15, a plurality of (two in FIG. 7) inductors 16, and a switch 17. The plurality of external connection terminals 18 include an antenna terminal 181, a first signal output terminal 182, and a second signal output terminal 183.

The plurality of switches 13, the plurality of matching circuits 14, the plurality of low noise amplifiers 15, and the plurality of inductors 16 are connected on a one-to-one basis. That is, a switch 131, a matching circuit 141, a low noise amplifier 151, and an inductor 161 are connected to one another. Furthermore, a switch 132, a matching circuit 142, a low noise amplifier 152, and an inductor 162 are connected to one another.

(2.1) Low Noise Amplifiers

Each of the plurality of low noise amplifiers 15 is an amplifier that amplifies a reception signal. Each of the plurality of low noise amplifiers 15 includes an input terminal (not illustrated in the drawing) and an output terminal (not illustrated in the drawing).

The input terminal of the low noise amplifier 151 is connected to a signal processing circuit 19 with the switch 17 interposed therebetween. The output terminal of the low noise amplifier 151 is connected to the switch 131 with the matching circuit 141 interposed therebetween.

The input terminal of the low noise amplifier 152 is connected to the signal processing circuit 19 with the switch 17 interposed therebetween. The output terminal of the low noise amplifier 152 is connected to the switch 132 with the matching circuit 142 interposed therebetween.

(2.2) Reception Filters

Each of the plurality of reception filters 121 to 124 is a filter that allows a reception signal to pass therethrough. Each of the plurality of reception filters 121 to 124 is, for example, an acoustic wave filter including a plurality of series-arm resonators and a plurality of parallel-arm resonators. The acoustic wave filter is, for example, a surface acoustic wave (SAW) filter using surface acoustic waves. Each of the reception filters 121 to 124 includes an input terminal (not illustrated in the drawing) and an output terminal (not illustrated in the drawing).

The input terminal of the reception filter 121 is connected to the antenna terminal 181 with the switch 11 interposed therebetween. The output terminal of the reception filter 121 is connected to the low noise amplifier 151 with the switch 131 interposed therebetween.

The input terminal of the reception filter 122 is connected to the antenna terminal 181 with the switch 11 interposed therebetween. The output terminal of the reception filter 122 is connected to the low noise amplifier 151 with the switch 131 interposed therebetween.

The input terminal of the reception filter 123 is connected to the antenna terminal 181 with the switch 11 interposed therebetween. The output terminal of the reception filter 123 is connected to the low noise amplifier 152 with the switch 132 interposed therebetween.

The input terminal of the reception filter 124 is connected to the antenna terminal 181 with the switch 11 interposed therebetween. The output terminal of the reception filter 124 is connected to the low noise amplifier 152 with the switch 132 interposed therebetween.

(2.3) Switch

The switch 11 performs switching of a filter to be connected to the antenna terminal 181 from among the plurality of reception filters 121 to 124. The switch 11 includes a common terminal 110 and selection terminals 111 to 114. The common terminal 110 is connected to the antenna terminal 181. The selection terminal 111 is connected to the reception filter 121. The selection terminal 112 is connected to the reception filter 122. The selection terminal 113 is connected to the reception filter 123. The selection terminal 114 is connected to the reception filter 124.

(2.4) Switches

The plurality of switches 13 perform switching of filters to be connected to the plurality of low noise amplifiers 15. The plurality of low noise amplifiers 15 are connected to the plurality of switches 13 on a one-to-one basis. More particularly, the switch 131 is connected to the low noise amplifier 151. The switch 132 is connected to the low noise amplifier 152.

The switch 131 performs switching of a filter to be connected to the low noise amplifier 151 from among the plurality of reception filters 121 to 122. The switch 131 includes a common terminal 1310 and selection terminals 1311 and 1312. The common terminal 1310 is connected to the low noise amplifier 151 with the matching circuit 141 interposed therebetween. The selection terminal 1311 is connected to the reception filter 121. The selection terminal 1312 is connected to the reception filter 122.

The switch 132 performs switching of a filter to be connected to the low noise amplifier 152 from among the plurality of reception filters 123 to 124. The switch 132 includes a common terminal 1320 and selection terminals 1321 and 1322. The common terminal 1320 is connected to the low noise amplifier 152 with the matching circuit 142 interposed therebetween. The selection terminal 1321 is connected to the reception filter 123. The selection terminal 1322 is connected to the reception filter 124.

Each of the plurality of switches 13 includes a ground terminal (not illustrated in the drawing).

(2.5) Switch

The switch 17 performs switching of a low noise amplifier to be connected to each of the first signal output terminal 182 and the second signal output terminal 183 from among the plurality of low noise amplifiers 15. The switch includes common terminals 173 and 174 and selection terminals 171 and 172. The common terminal 173 is connected to the first signal output terminal 182. The common terminal 174 is connected to the second signal output terminal 183. The selection terminal 171 is connected to the low noise amplifier 151. The selection terminal 172 is connected to the low noise amplifier 152.

(2.6) Matching Circuits

The matching circuit 141 is a circuit for performing impedance matching between the output terminal of the low noise amplifier 151 and the common terminal 1310 of the switch 131. The matching circuit 141 includes at least one of one or more capacitors and one or more inductors.

The matching circuit 142 is a circuit for performing impedance matching between the output terminal of the low noise amplifier 152 and the common terminal 1320 of the switch 132. The matching circuit 142 includes at least one of one or more capacitors and one or more inductors.

(2.7) Inductors

The plurality of inductors 16 are associated with the plurality of low noise amplifiers 15 on a one-to-one basis.

The inductor 161 is an inductor that is connected between a ground terminal of the low noise amplifier 151, the matching circuit 141, and the ground.

The inductor 162 is an inductor that is connected between a ground terminal of the low noise amplifier 152, a ground terminal of the matching circuit 142, and the ground.

(3) Structure of High Frequency Module

A structure of the high frequency module 1 according to the first embodiment will be described below with reference to drawings.

The high frequency module 1 according to the first embodiment includes, for example, a mounting substrate 2 and an IC chip 10, as illustrated in FIG. 1.

(3.1) Mounting Substrate

The mounting substrate 2 has, as illustrated in FIG. 1, a first main surface 21 and a second main surface 22. The first main surface 21 and the second main surface 22 are opposite each other in a first direction D1.

The IC chip 10 is disposed on the first main surface 21 of the mounting substrate 2.

The mounting substrate 2 is, for example, a multilayer substrate including a plurality of dielectric layers and a plurality of conductive layers. The plurality of dielectric layers and the plurality of conductive layers are laminated in the first direction D1. The plurality of conductive layers are formed in predetermined patterns determined for individual layers. Each of the plurality of conductive layers includes one or a plurality of conductor units on a plane that is orthogonal to the first direction D1. A material of each of the conductive layers is, for example, copper. The plurality of conductive layers include a plurality of ground layers to which a ground potential is applied. The plurality of ground layers include a first ground layer 23 and a second ground layer 24. That is, the mounting substrate 2 includes the first ground layer 23 and the second ground layer 24. The first ground layer 23 is disposed between the first main surface 21 and the second main surface 22. The second ground layer 24 is disposed between the first ground layer 23 and the second main surface 22. That is, the first main surface 21, the first ground layer 23, the second ground layer 24, and the second main surface 22 are arranged in this order in the first direction D1. The area of a conductor unit at the ground potential in each of the first ground layer 23 and the second ground layer 24 is 50% or more in a plan view from the first direction D1. In the high frequency module 1, a plurality of ground terminals and the ground layers are electrically connected with via conductors or the like of the mounting substrate 2 interposed therebetween.

The mounting substrate 2 is, for example, a low temperature co-fired ceramics (LTCC) substrate. The mounting substrate 2 is not limited to an LTCC substrate and may be, for example, a high temperature co-fired ceramics (HTCC) substrate, a printed wiring board, or a resin multilayer substrate.

Furthermore, the mounting substrate 2 is not limited to an LTCC substrate and may be, for example, a wiring structure. The wiring structure is, for example, a multilayer structure. The multilayer structure includes at least one insulating layer and at least one conductive layer. The insulating layer is formed in a predetermined pattern. In the case where a plurality of insulating layers are provided, the plurality of insulating layers are formed in predetermined patterns determined for individual layers. The conductive layer is formed in a predetermined pattern that is different from the predetermined pattern of the insulating layer. In the case where a plurality of conductive layers are provided, the plurality of conductive layers are formed in predetermined patterns determined for individual layers. The conductive layer may include one or a plurality of rewiring units. In the wiring structure, a first surface, out of two surfaces that are opposite each other in the thickness direction of the multilayer structure, is the first main surface 21 of the mounting substrate 2, and a second surface is the second main surface 22 of the mounting substrate 2. The wiring structure may be, for example, an interposer. The interposer may be an interposer including a silicon substrate or may be a substrate including multiple layers.

(3.2) IC Chip

The IC chip 10 is disposed on the first main surface 21 of the mounting substrate 2. The IC chip 10 has, for example, a rectangular shape that is elongate in a third direction D3 in a plan view from the first direction D1. A second direction D2 and the third direction D3 are orthogonal to each other and both the second direction D2 and the third direction D3 are orthogonal to the first direction D1.

Figure 2:
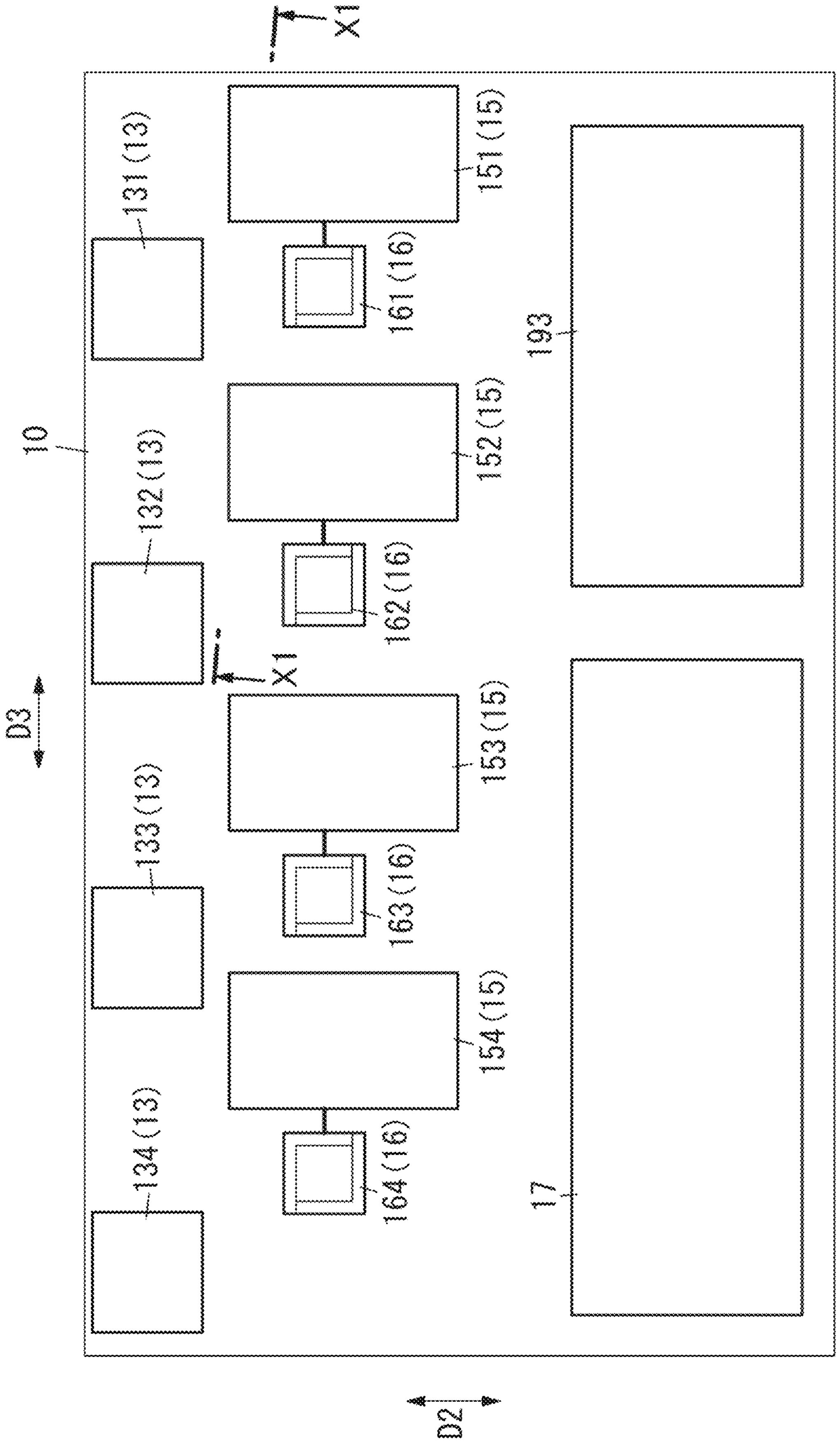
FIG. 2 is a perspective plan view of an IC chip in the high frequency module.

The IC chip 10 includes, for example, elements provided at a plurality of reception paths in the high frequency module. More particularly, as illustrated in FIG. 2, the IC chip 10 includes the plurality of (four in FIG. 3) switches 13 and the plurality of (four in FIG. 3) low noise amplifiers 15. The IC chip 10 further includes the plurality of (four in FIG. 3) inductors 16, the switch 17, and a control circuit 193.

The plurality of switches 13 are associated with the plurality of low noise amplifiers 15 on the one-to-one basis, as described above. The plurality of switches 13 include switches 131 to 134. The plurality of low noise amplifiers 15 include low noise amplifiers 151 to 154. The low noise amplifier 151 is connected to the switch 131. The low noise amplifier 152 is connected to the switch 132. The low noise amplifier 153 is connected to the switch 133. The low noise amplifier 154 is connected to the switch 134. The switch 131 corresponds to a first switch in the present disclosure, and the switch 132 corresponds to a second switch in the present disclosure. The low noise amplifier 151 corresponds to a first low noise amplifier in the present disclosure, and the low noise amplifier 152 corresponds to a second low noise amplifier in the present disclosure.

The inductors 16 each include, for example, a plurality of pattern conductors disposed along the first direction D1 and a via conductor connecting two pattern conductors that are adjacent to each other in the first direction D1. Each of the plurality of pattern conductors has, for example, an L shape, a straight line shape, an arc shape, or the like. For example, the winding axis of the inductor 16 is along the first direction D1. The control circuit 193 is, for example, a circuit that supplies power to the low noise amplifiers 15 and controls the switches 13 and the switch 17.

The IC chip 10 is, for example, flip-mounted on the first main surface 21 of the mounting substrate 2. The IC chip 10 is, for example, connected to the mounting substrate 2 by a plurality of conductive bumps. A material of a conductive bump is, for example, solder, gold, or copper.

(4) Details of Mounting Substrate (4.1) Arrangement of Via Conductors

The details of the structure of the high frequency module 1 will be described below with reference to FIGS. 1 to 5. FIGS. 2 to 5 illustrate regions that overlap in a plan view from the first direction D1. Furthermore, an X1-X1 cross-section in each of FIGS. 2 to 5 corresponds to FIG. 1. A dot region in FIG. 4 indicates a region where the first ground layer 23 exists. A dot region in FIG. 5 indicates a region where the second ground layer 24 exists. That is, the dot regions in FIGS. 4 and 5 indicate surfaces of the first ground layer 23 and the second ground layer 24 not cross-sections of the first ground layer 23 and the second ground layer 24.

A plurality of conductor units 25 are disposed on the first main surface 21 of the mounting substrate 2. Furthermore, the mounting substrate 2 includes a plurality of via conductors V1 to V5. The plurality of via conductors V1 to V5 include a plurality of via conductors V1, a plurality of via conductors V2, a plurality of via conductors V3, a plurality of via conductors V4, and a plurality of via conductors V5. The plurality of via conductors V1 form a first via conductor group. The plurality of via conductors V2 form a second via conductor group. The plurality of via conductors V3 form a third via conductor group.

The plurality of conductor units 25 are disposed on the first main surface 21 of the mounting substrate 2. Each of the plurality of conductor units 25 has a first end and a second end. The first end of each of the plurality of conductor units 25 is connected to the IC chip 10. The second end of each of the plurality of conductor units 25 is connected to another electronic component (not illustrated in the drawing) disposed on the first main surface 21 of the mounting substrate 2. The plurality of conductor units 25 include, for example, signal wiring units that allow signals from the reception filters 121 to 124 to be input to the plurality of switches 13. Furthermore, the plurality of conductor units 25 include, for example, voltage wiring units that supply voltage for driving the IC chip 10.

Each of the plurality of via conductors V1 included in the first via conductor group connects the first main surface 21 to the first ground layer 23 in the first direction D1, which is the thickness direction of the mounting substrate 2, as illustrated in FIG. 1 and FIGS. 3 to 5. Each of the plurality of via conductors V1 has, for example, a cylindrical shape. The first ends of the plurality of via conductors V1 are arranged on the first main surface 21 of the mounting substrate 2 and are connected to the plurality of switches 13 included in the IC chip 10 on a one-to-one basis. The second end of each of the plurality of via conductors V1 is connected to the first ground layer 23. That is, the first via conductor group connects the plurality of switches 13 to the first ground layer 23. More particularly, a via conductor V11 is connected to the switch 131. A via conductor V12 is connected to the switch 132. A via conductor V13 is connected to the switch 133. A via conductor V14 is connected to the switch 134. The via conductor V11 corresponds to a first via conductor in the present disclosure. The via conductor V12 corresponds to a second via conductor in the present disclosure.

Figure 3:
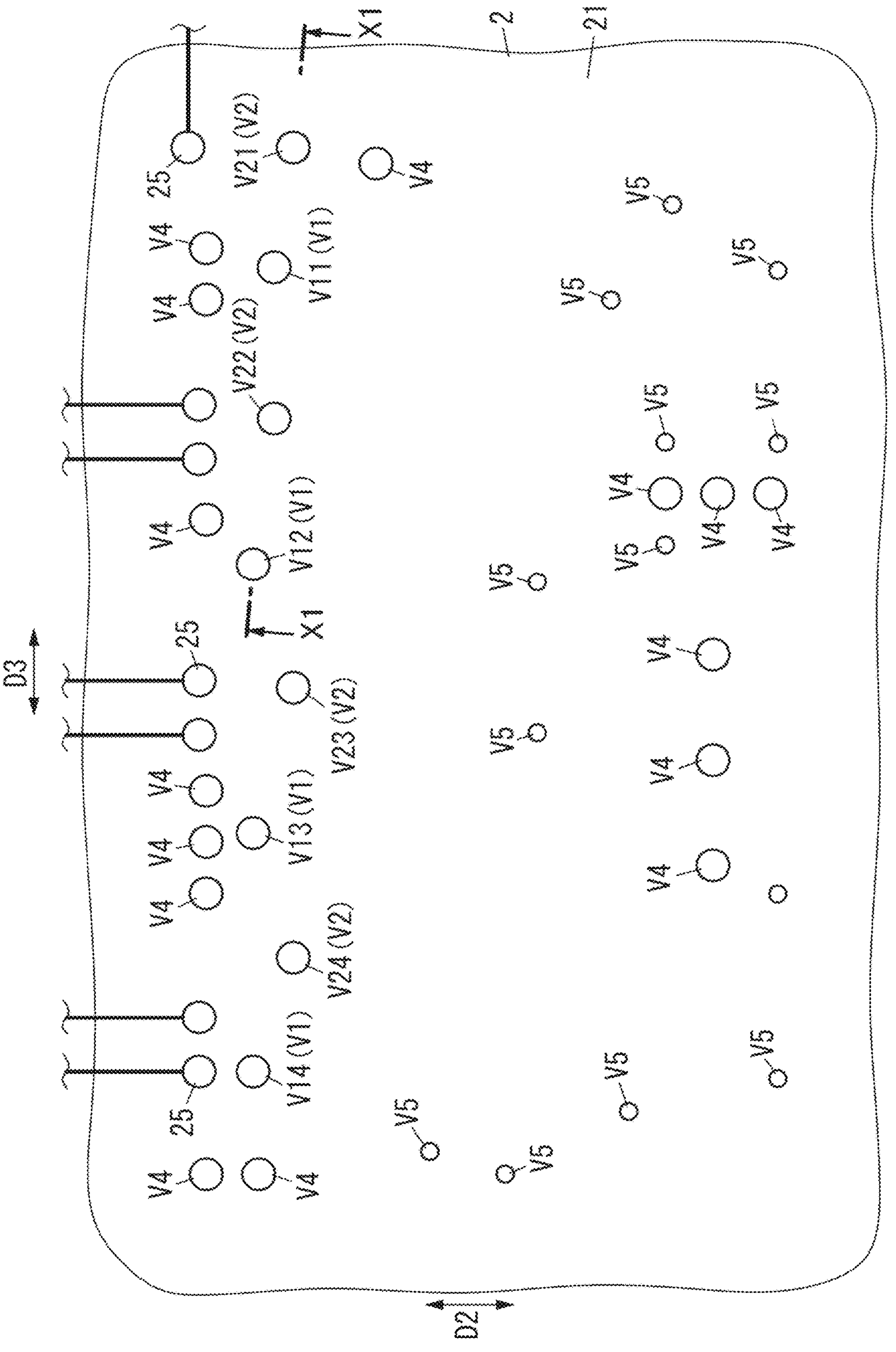
FIG. 3 is a plan view of a mounting substrate in the high frequency module.
Figure 4:
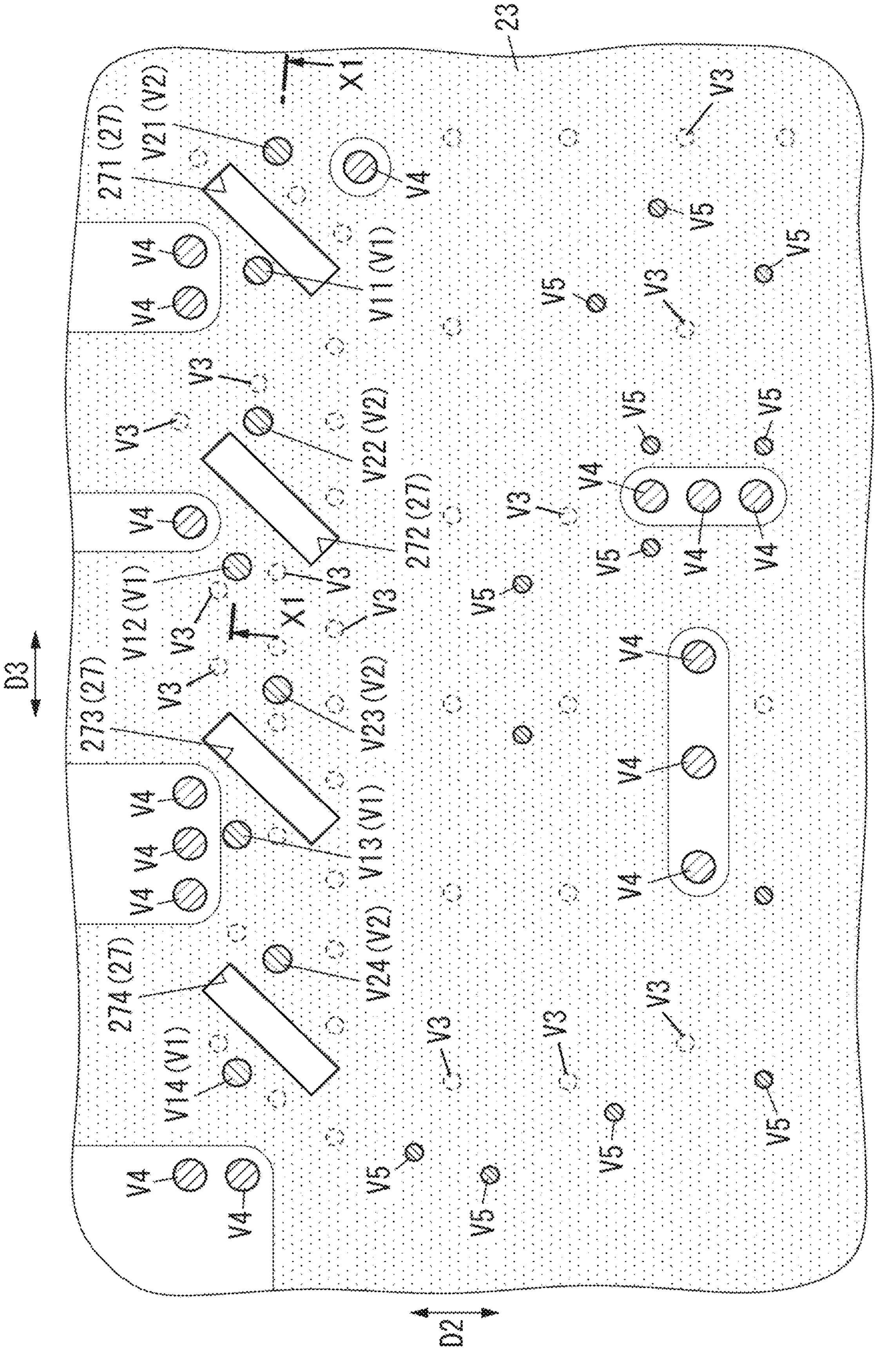
FIG. 4 is a plan view of a first ground layer in the high frequency module.
Figure 5:
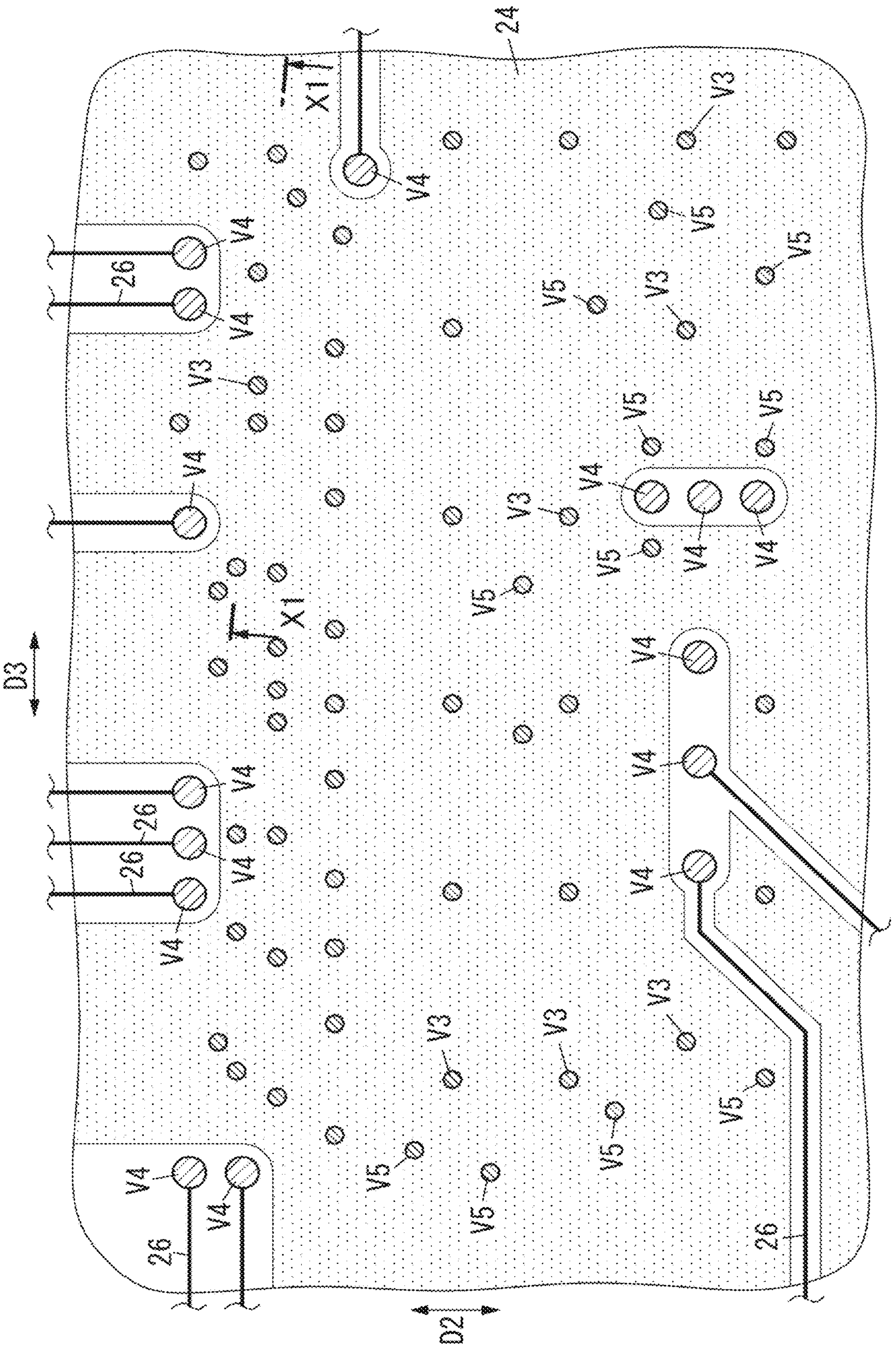
FIG. 5 is a plan view of a second ground layer in the high frequency module.

Each of the plurality of via conductors V2 included in the second via conductor group connects the first main surface 21 to the first ground layer 23 in the first direction D1, which is the thickness direction of the mounting substrate 2, as illustrated in FIGS. 3 to 5. Each of the plurality of via conductors V2 has, for example, a cylindrical shape. The first ends of the plurality of via conductors V2 are arranged on the first main surface 21 of the mounting substrate 2 and are connected to the plurality of low noise amplifiers 15 included in the IC chip 10 on a one-to-one basis. More particularly, the plurality of via conductors V2 are connected to the plurality of inductors 16 that are connected to the plurality of low noise amplifiers 15. The second end of each of the plurality of via conductors V2 is connected to the first ground layer 23. That is, the second via conductor group connects the plurality of low noise amplifiers 15 to the first ground layer 23. More particularly, a via conductor V21 is connected to the low noise amplifier 151. A via conductor V22 is connected to the low noise amplifier 152. A via conductor V23 is connected to the low noise amplifier 153. A via conductor V24 is connected to the low noise amplifier 154. The via conductor V21 corresponds to a third via conductor in the present disclosure. The via conductor V22 corresponds to a fourth via conductor in the present disclosure.

The plurality of via conductors V1 included in the first via conductor group are associated with the plurality of via conductors V2 included in the second via conductor group on a one-to-one basis. The state in which one via conductor V1 is associated with one via conductor V2 represents the state in which a switch 13 connected to one via conductor V1 and a low noise amplifier 15 connected to one via conductor V2 are connected to each other. More particularly, the via conductor V11 is associated with the via conductor V21. The via conductor V12 is associated with the via conductor V22. The via conductor V13 is associated with the via conductor V23. The via conductor V14 is associated with the via conductor V24.

The first via conductor group and the second via conductor group are disposed in an end portion of the IC chip 10 in a plan view from the first direction D1. "The first via conductor group and the second via conductor group are disposed in an end portion of the IC chip 10 in a plan view from the first direction D1" represents the state in which the distance from each of the plurality of via conductors V1 and each of the plurality of via conductors V2 to an outer edge of the IC chip 10 is less than or equal to half a short side of the IC chip 10. More particularly, as illustrated in FIGS. 3 and 4, each of the plurality of via conductors V1 and each of the plurality of via conductors V2 are disposed along one end in the second direction D2 of the IC chip 10 (upper side of the drawings).

Furthermore, each of the plurality of via conductors V1 and each of the plurality of via conductors V2 are arranged alternately in a plan view from the first direction D1. More particularly, the via conductor V11, the via conductor V21, the via conductor V12, the via conductor V22, the via conductor V13, the via conductor V23, the via conductor V14, and the via conductor V24 are arranged in this order in the third direction D3.

The third via conductor group connects the first ground layer 23 to the second ground layer 24 in the first direction D1, which is the thickness direction of the mounting substrate 2. More particularly, each of the plurality of via conductors V3 included in the third via conductor group connects the first ground layer 23 to the second ground layer 24 in the first direction D1, as illustrated in FIGS. 1, 4, and 5. Each of the plurality of via conductors V3 has, for example, a cylindrical shape. The first end of each of the plurality of via conductors V3 is connected to the first ground layer 23. The second end of each of the plurality of via conductors V3 is connected to the second ground layer 24. The third via conductor group is disposed around the first via conductor group and the second via conductor group. More particularly, as illustrated in FIG. 4, the density of the plurality of via conductors V3 around the via conductors V1 and the via conductors V2 is higher than the density of the plurality of via conductors V3 in positions not around the via conductors V1 or the via conductors V2. Thus, a potential difference inside the first ground layer 23 can be reduced, and the potential of the first ground layer 23 can be made much closer to the ground potential.

Each of the plurality of via conductors V4 penetrates through the mounting substrate 2 from the first main surface 21 up to at least the second ground layer 24 in the first direction D1, as illustrated in FIGS. 3 to 5. Each of the plurality of via conductors V4 has, for example, a cylindrical shape. The first end of each of the plurality of via conductors V4 is arranged on the first main surface 21 of the mounting substrate 2 and is connected to the IC chip 10. The second end of each of the plurality of via conductors V4 is connected to a conductor 26 on the same plane as the second main surface 22, as illustrated in FIG. 5 or a conductor unit (not illustrated in the drawing) that is closer to the second main surface 22 than the second ground layer 24 is. Each of the plurality of via conductors V4 is not in contact with the first ground layer 23 or the second ground layer 24. The plurality of via conductors V4 include, for example, wiring units that allow signals from the switch 17 to be input to the external connection terminals 18. The plurality of via conductors V4 also include, for example, power supply circuits that supply voltage for driving the IC chip 10.

Each of the plurality of via conductors V5 connects the first main surface 21 to the second ground layer 24 in the first direction D1, as illustrated in FIGS. 3 to 5. Each of the plurality of via conductors V5 has, for example, a cylindrical shape. The first end of each of the plurality of via conductors V5 is connected to, for example, a land electrode (not illustrated in the drawing) at the ground potential disposed on the first main surface 21. The second end of each of the plurality of via conductors V5 is connected to the second ground layer 24.

(4.2) Relationship Between Via Conductors and First Ground Layer

Figure 6:
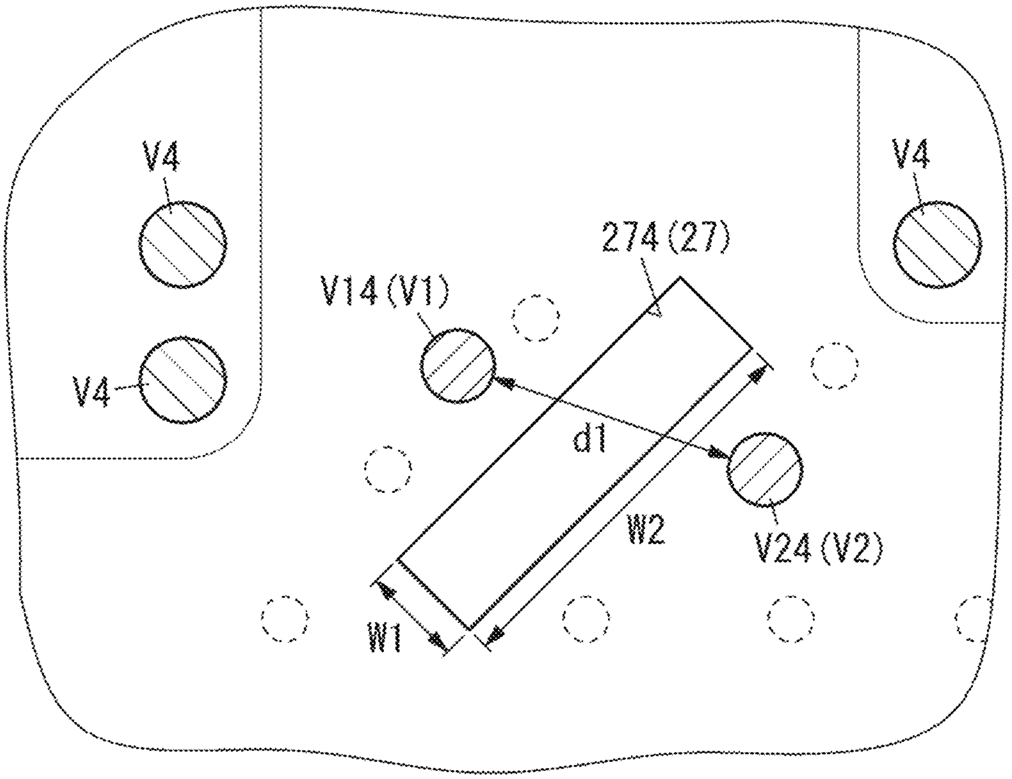
FIG. 6 is an enlarged plan view of the first ground layer in the high frequency module.

As illustrated in FIGS. 1, 4, and 6, the first ground layer 23 has a plurality of slits 27.

Each of the plurality of slits 27 is provided between one of the plurality of via conductors V1 included in the first via conductor group and a via conductor V2 corresponding to the via conductor V1 among the plurality of via conductors V2 included in the second via conductor group in a plan view from the first direction D1. That is, a switch 13 that is connected to a via conductor V1 of the first via conductor group and a low noise amplifier 15 that is connected to a via conductor V2 of the second via conductor group are connected to each other.

More particularly, a slit 271 is arranged between the via conductor V11 and the via conductor V21. The via conductor V11 is connected to the switch 131. The via conductor V21 is connected to the low noise amplifier 151. The low noise amplifier 151 is connected to the switch 131. The slit 271 corresponds to a first slit in the present disclosure. Thus, signal interference due to connection through the first ground layer 23 between the ground terminal of the switch 131 and the ground terminal of the low noise amplifier 151 can be reduced. That is, the isolation between the switch 131 and the low noise amplifier 151 can be improved.

Similarly, a slit 272 is arranged between the via conductor V12 and the via conductor V22. The via conductor V12 is connected to the switch 132. The via conductor V22 is connected to the low noise amplifier 152. The low noise amplifier 152 is connected to the switch 132. The slit 272 corresponds to a second slit in the present disclosure. Thus, signal interference due to connection through the first ground layer 23 between the ground terminal of the switch 132 and the ground terminal of the low noise amplifier 152 can be reduced. That is, the isolation between the switch 132 and the low noise amplifier 152 can be improved.

Similarly, a slit 273 is arranged between the via conductor V13 and the via conductor V23. The via conductor V13 is connected to the switch 133. The via conductor V23 is connected to the low noise amplifier 153. The low noise amplifier 153 is connected to the switch 133. Thus, signal interference due to connection through the first ground layer 23 between the ground terminal of the switch 133 and the ground terminal of the low noise amplifier 153 can be reduced. That is, the isolation between the switch 133 and the low noise amplifier 153 can be improved.

Similarly, a slit 274 is arranged between the via conductor V14 and the via conductor V24. The via conductor V14 is connected to the switch 134. The via conductor V24 is connected to the low noise amplifier 154. The low noise amplifier 154 is connected to the switch 134. Thus, signal interference due to connection through the first ground layer 23 between the ground terminal of the switch 134 and the ground terminal of the low noise amplifier 154 can be reduced. That is, the isolation between the switch 134 and the low noise amplifier 154 can be improved.

Furthermore, as illustrated in FIG. 4, in the high frequency module 1, the slits 27 are present between all the via conductors V1 and corresponding via conductors V2. That is, one of the plurality of slits 27 is arranged between each of the plurality of via conductors V1 included in the first via conductor group and a corresponding via conductor V2 of the second via conductor group. Thus, in the high frequency module 1, the isolation between each of all the plurality of switches 13 and a corresponding connected low noise amplifier 15 can be improved.

Furthermore, each of the plurality of via conductors V1 and each of the plurality of via conductors V2 are arranged alternately in a plan view from the first direction D1. Thus, as illustrated in FIG. 4, combinations each including one of the plurality of via conductors V1, one of the plurality of slits 27, and one of the plurality of via conductors V2 are arranged adjacent to each other in a plan view from the first direction D1. "Combinations each including one of the plurality of via conductors V1, one of the plurality of slits 27, and one of the plurality of via conductors V2 are arranged adjacent to each other" represents the state in which a via conductor V1, a via conductor V2, or a slit 27 is not present between a combination of a via conductor V1, a slit 27, and a via conductor V2 and a combination of a via conductor V1, a slit 27, and a via conductor V2.

More particularly, the via conductor V11, the slit 271, the via conductor V21, the via conductor V12, the slit 272, the via conductor V22, the via conductor V13, the slit 273, the via conductor V23, the via conductor V14, the slit 274, and the via conductor V24 are arranged in this order in the third direction D3. Thus, the combination of the via conductor V11, the slit 271, and the via conductor V21 and the combination of the via conductor V12, the slit 272, and the via conductor V22 are arranged adjacent to each other. Therefore, signal interference due to connection through the first ground layer 23 between the plurality of via conductors V1 can be reduced. Furthermore, signal interference due to connection through the first ground layer 23 between the plurality of via conductors V2 can be reduced. Thus, the isolation between the plurality of switches 13 and the plurality of low noise amplifiers 15 can be improved easily.

Furthermore, the plurality of via conductors V1 and the plurality of via conductors V2 are disposed in the end portion of the IC chip 10 in a plan view from the first direction D1. Thus, as illustrated in FIG. 4, the first via conductor group, the plurality of slits 27, and the second via conductor group are arranged in the end portion of the IC chip 10 in a plan view from the first direction D1. Therefore, the plurality of via conductors V1, the plurality of via conductors V2, and the plurality of slits 27 can be easily arranged in a regular manner at the mounting substrate 2. Thus, the same degree of improvement in isolation can be achieved in all the combinations each including a switch 13 and a low noise amplifier 15.

(4.3) Shape of Slits

As illustrated in FIGS. 4 and 6, in a plan view from the first direction D1, each of the plurality of slits 27 is elongate in a direction that intersects a direction connecting a via conductor V1 to a via conductor V2, the slit 27 being arranged between the via conductor V1 and the via conductor V2. More particularly, the slit 271 is elongate in a direction that intersects a direction connecting the via conductor V11 to the via conductor V21. Similarly, the slit 272 is elongate in a direction that intersects a direction connecting the via conductor V12 to the via conductor V22. Similarly, the slit 273 is elongate in a direction that intersects a direction connecting the via conductor V13 to the via conductor V23. Similarly, the slit 274 is elongate in a direction that intersects a direction connecting the via conductor V14 to the via conductor V24.

More particularly, a width W1 of the slit 27 is less than or equal to a distance d1 between the via conductor V1 and the via conductor V2. Specifically, as illustrated in FIG. 6, the width W1 of the slit 274 is less than or equal to the distance d1 between the via conductor V14 and the via conductor V24. Similarly, the width W1 of the slit 271 is less than or equal to the distance d1 between the via conductor V11 and the via conductor V21.

Furthermore, a length W2 of the slit 27 is equal to or more than twice the width W1 of the slit 27.

Thus, the length of a path inside the first ground layer 23 for electrically connecting the via conductor V1 to the via conductor V2 is sufficiently longer than the distance d1 between the via conductor V1 and the via conductor V2. Therefore, interference, through the via conductors V1, the via conductors V2, and the first ground layer 23, between the plurality of switches 13 and the plurality of low noise amplifiers 15 can further be reduced.

(5) Communication Apparatus

The communication apparatus 100 includes, as illustrated in FIG. 7, the high frequency module 1, the signal processing circuit 19, and an antenna 101.

The antenna 101 is connected to the antenna terminal 181 of the high frequency module 1. The antenna 101 has a transmission function for radiating, as a radio wave, a transmission signal output from the high frequency module 1 and a reception function for receiving, as a radio wave, a reception signal from the outside and outputting the reception signal to the high frequency module 1.

The signal processing circuit 19 includes an RF signal processing circuit 191 and a baseband signal processing circuit 192. The signal processing circuit 19 processes signals passing through the high frequency module 1. More particularly, the signal processing circuit 19 processes a transmission signal and a reception signal.

The RF signal processing circuit 191 is, for example, a radio frequency integrated circuit (RFIC). The RF signal processing circuit 191 performs signal processing for high frequency signals.

The RF signal processing circuit 191 performs signal processing and amplification such as up-conversion for a transmission signal transmitted from the baseband signal processing circuit 192 and outputs the transmission signal for which the signal processing has been performed to the high frequency module 1. Furthermore, the RF signal processing circuit 191 performs signal processing such as amplification and down-conversion for a reception signal output from the high frequency module 1 and outputs the reception signal for which the signal processing has been performed to the baseband signal processing circuit 192.

The baseband signal processing circuit 192 is, for example, a baseband integrated circuit (BBIC). The baseband signal processing circuit 192 performs predetermined signal processing for a transmission signal from the outside of the signal processing circuit 19. A reception signal processed by the baseband signal processing circuit 192 is, for example, used as an image signal for image display or used as an audio signal for conversation.

The RF signal processing circuit 191 also has a function as a controller for controlling connection of the switches 11, 13, and 17 included in the high frequency module 1, based on transmission and reception of high frequency signals (transmission signal, reception signal). Specifically, the RF signal processing circuit 191 performs switching of connection of the switches 11, 13, and 17 in the high frequency module 1 in accordance with a control signal (not illustrated in the drawing). The controller may be provided outside the RF signal processing circuit 191. For example, the controller may be provided in the high frequency module 1 or the baseband signal processing circuit 192.

(6) Effects

The high frequency module 1 according to the first embodiment includes the mounting substrate 2 and the IC chip 10. The mounting substrate 2 is a multilayer substrate and has the first main surface 21 and the second main surface 22 that are opposite each other. The IC chip 10 is disposed on the first main surface 21 of the mounting substrate 2. The IC chip 10 includes the plurality of switches 13 and the plurality of low noise amplifiers 15. The plurality of low noise amplifiers 15 are connected to the plurality of switches 13 on a one-to-one basis. The plurality of switches 13 include the switch 131 and the switch 132. The plurality of low noise amplifiers 15 include the low noise amplifier 151 that is connected to the switch 131 and the low noise amplifier 152 that is connected to the switch 132. The mounting substrate 2 includes the first ground layer 23, the second ground layer 24, the first via conductor group, the second via conductor group, and the third via conductor group. The first ground layer 23 is disposed between the first main surface 21 and the second main surface 22. The second ground layer 24 is disposed between the first ground layer 23 and the second main surface 22. The first via conductor group connects the plurality of switches 13 to the first ground layer 23. The second via conductor group connects the plurality of low noise amplifiers 15 to the first ground layer 23. The third via conductor group connects the first ground layer 23 to the second ground layer 24. The first ground layer 23 has the plurality of slits 27. The third via conductor group is disposed around the first via conductor group and the second via conductor group in a plan view from the thickness direction D1 of the mounting substrate 2. The first via conductor group includes the via conductor V11 that is connected to the switch 131 and the via conductor V12 that is connected to the switch 132. The second via conductor group includes the via conductor V21 that is connected to the low noise amplifier 151 and the via conductor V22 that is connected to the low noise amplifier 152. In a plan view from the thickness direction D1 of the mounting substrate 2, the plurality of slits 27 include the slit 271 that is arranged between the via conductor V11 and the via conductor V21 and the slit 272 that is connected between the via conductor V12 and the via conductor V22. A combination of the via conductor V11, the slit 271, and the via conductor V21 and a combination of the via conductor V12, the slit 272, and the via conductor V22 are arranged adjacent to each other. Thus, leakage of a signal through the first ground layer 23 between the plurality of switches 13 and the plurality of low noise amplifiers 15 can be reduced. Therefore, the isolation between each of the plurality of switches 13 and each of the plurality of low noise amplifiers 15 can be improved.

In the high frequency module 1 according to the first embodiment, the first via conductor group, the second via conductor group, and the plurality of slits 27 of the first ground layer 23 are arranged in an end portion of the IC chip 10 in a plan view from the first direction D1. Thus, the plurality of via conductors V1, the plurality of via conductors V2, and the plurality of slits 27 can be arranged in a regular manner at the mounting substrate 2. Therefore, the same degree of improvement in isolation can be achieved in all the combinations each including a switch 13 and a low noise amplifier 15.

Furthermore, in the high frequency module 1 according to the first embodiment, each of the slits 27 is elongate in a direction that intersects a direction connecting the via conductor V11 to the via conductor V21 in a plan view from the first direction D1. The width W1 of the slit 27 is less than or equal to the distance d1 between the via conductor V11 and the via conductor V21 in a plan view from the first direction D1. Thus, the length of a path inside the first ground layer 23 for electrically connecting the via conductor V11 to the via conductor V21 is sufficiently longer than the distance d1 between the via conductor V11 and the via conductor V21. Therefore, interference between the switch 131 and the low noise amplifier 151 can further be reduced.

Furthermore, in the high frequency module 1 according to the first embodiment, the length W2 of the slit 271 is equal to or more than twice the width W1 of the slit 271 in a plan view from the first direction D1. Thus, the length of the path inside the first ground layer 23 for electrically connecting the via conductor V11 to the via conductor V21 is sufficiently longer than the distance d1 between the via conductor V11 and the via conductor V21. Therefore, the interference between the switch 131 and the low noise amplifier 151 can further be reduced.

Furthermore, in the high frequency module 1 according to the first embodiment, the plurality of via conductors V1 included in the first via conductor group are associated with the plurality of via conductors V2 included in the second via conductor group on a one-to-one basis. One of the plurality of slits 27 is arranged between each of the plurality of via conductors V1 included in the first via conductor group and a corresponding via conductor V2 of the second via conductor group. Thus, in the high frequency module 1, the isolation between each of all the plurality of switches 13 and a connected low noise amplifier 15 can be improved.

Furthermore, the communication apparatus 100 according to the first embodiment includes the high frequency module 1 and the signal processing circuit 19 that is connected to the high frequency module 1. Thus, in the communication apparatus 100 according to the first embodiment, the isolation between each of the plurality of switches 13 and each of the plurality of low noise amplifiers 15 can be improved in the high frequency module 1.

Second Embodiment (1) Configuration

In a high frequency module 1 according to a second embodiment, the first ground layer 23 has a plurality of slits 27*a*.

Figure 8:
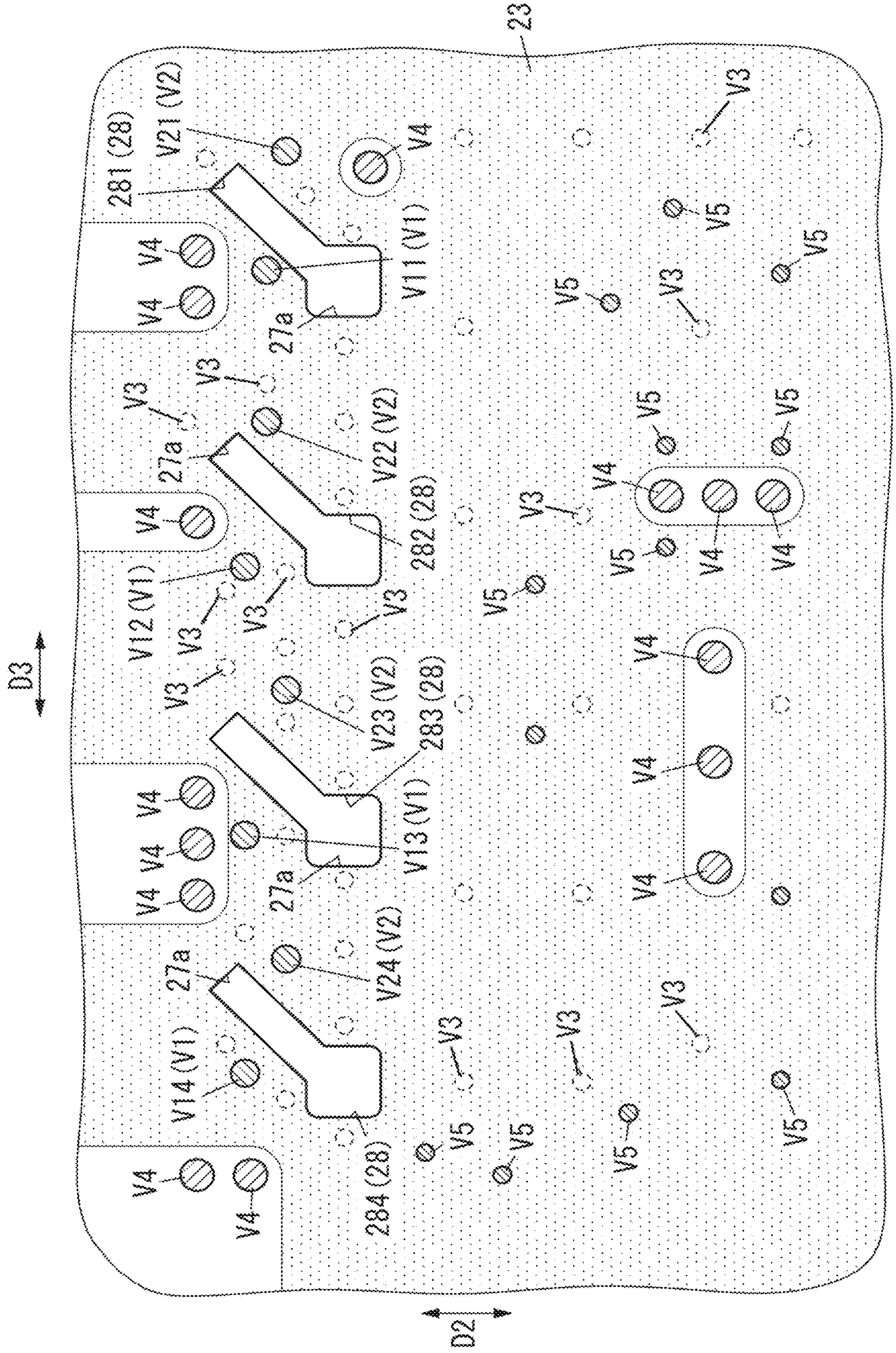
FIG. 8 is a plan view of a first ground layer in a high frequency module according to a second embodiment.

As illustrated in FIG. 8, the first ground layer 23 has the plurality of slits 27*a*. Each of the plurality of slits 27*a* includes a first part 28. The first part 28 overlaps the inductor 16 (see FIG. 2) in a plan view from the first direction D1. "The first part 28 overlaps the inductor 16 in a plan view from the first direction D1" represents the state in which at least part of a region where the inductor 16 exists is located inside the first part 28 in a plan view from the first direction D1.

Specifically, a first part 281 overlaps the inductor 161 (see FIG. 2) in a plan view from the first direction D1. A first part 282 overlaps the inductor 162 (see FIG. 2). A first part 283 overlaps the inductor 163 (see FIG. 2). A first part 284 overlaps the inductor 164 (see FIG. 2).

Thus, in the high frequency module 1 according to the second embodiment, each of the plurality of inductors 16 overlaps any one of the plurality of slits 27*a* in a plan view from the first direction D1. Therefore, electromagnetic coupling between each of the plurality of inductors 16 and the first ground layer 23 can be reduced. In particular, parasitic capacitance of the plurality of inductors 16 can be reduced. Accordingly, inflow of noise to the plurality of low noise amplifiers 15 can be reduced.

Furthermore, in the high frequency module 1 according to the second embodiment, since the plurality of slits 27*a* each include the first part 28, the area of the plurality of slits 27*a* is larger than the area of the plurality of slits 27 in the high frequency module 1 according to the first embodiment. Therefore, the length of a path inside the first ground layer 23 for electrically connecting the via conductors V1 to the via conductors V2 is further increased, and the interference between the switches 13 and the low noise amplifiers 15 can further be reduced.

(2) Effects

In the high frequency module 1 according to the second embodiment, the IC chip 10 further includes the plurality of inductors 16 that are associated with the plurality of low noise amplifiers 15 on a one-to-one basis. Each of the plurality of inductors 16 is connected between a corresponding low noise amplifier 15 out of the plurality of low noise amplifiers 15 and the via conductor V2 that is connected to the corresponding low noise amplifier 15 in the second via conductor group. One of the plurality of inductors 16 overlaps the slit 27*a* in a plan view from the first direction D1. Thus, electromagnetic coupling between each of the plurality of inductors 16 and the first ground layer 23 can be reduced, and inflow of noise to the plurality of low noise amplifiers 15 can be reduced. Furthermore, since the length of the path inside the first ground layer 23 for electrically connecting the via conductors V1 to the via conductors V2 is further increased, the interference between the switches 13 and the low noise amplifiers 15 can further be reduced.

Third Embodiment

In a high frequency module 1 according to a third embodiment, combinations each including the via conductor V1, the slit 27, and the via conductor V2 are arranged along the outer circumference of the IC chip 10 in a plan view from the first direction D1. Thus, the combinations each including the via conductor V1, the slit 27, and the via conductor V2 are arranged not only in the third direction D3 but also in the second direction D2.

Figure 9:
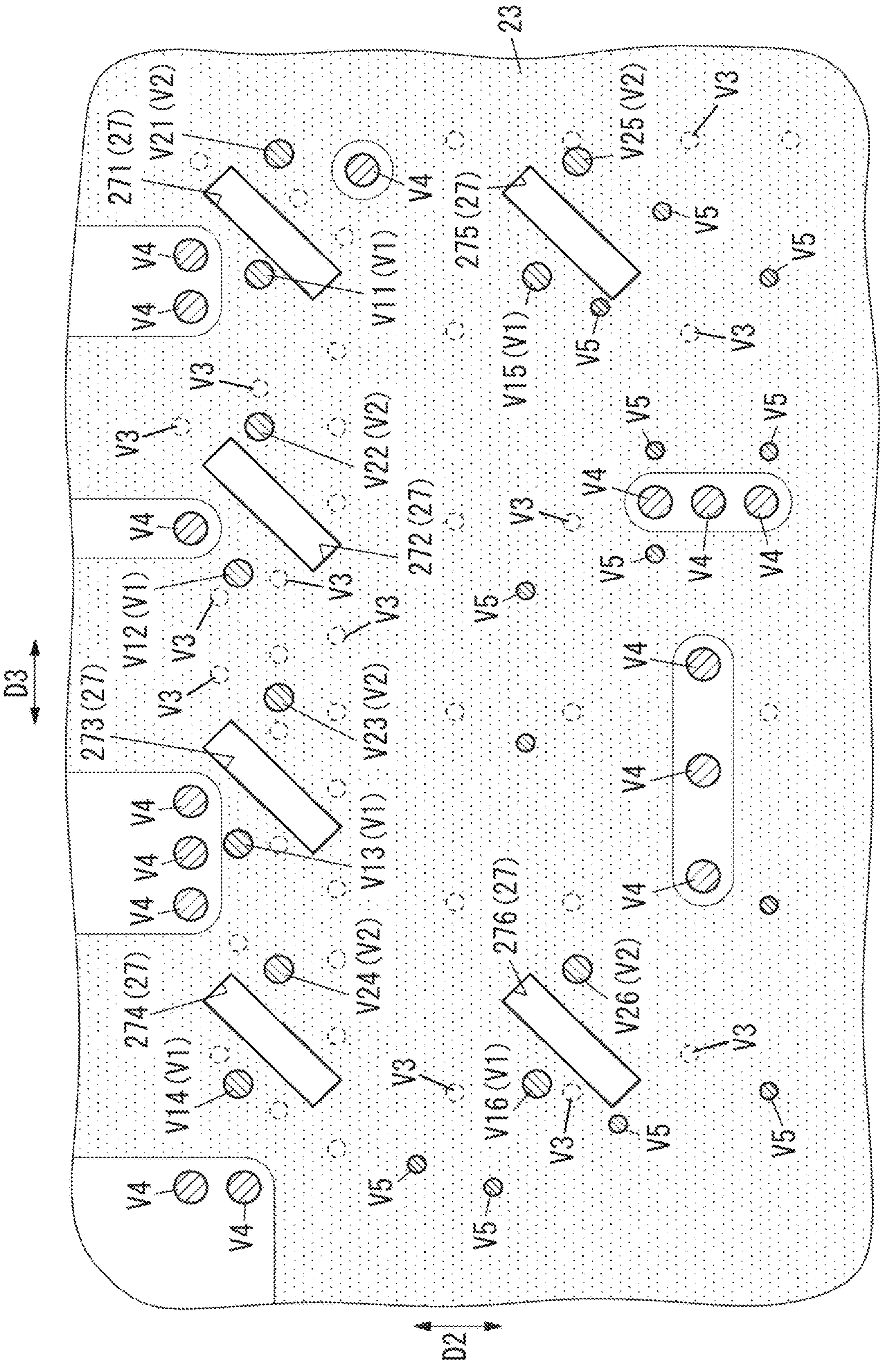
FIG. 9 is a plan view of a first ground layer in a high frequency module according to a third embodiment.

More particularly, as illustrated in FIG. 9, the via conductors V1 and the via conductors V2 are disposed in a U shape along the outer circumference of the IC chip 10. More particularly, the via conductor V15 and the via conductor V25; and the via conductor V11 and the via conductor V21 are arranged in the second direction D2. Similarly, the via conductor V16 and the via conductor V26; and the via conductor V14 and the via conductor 24 are arranged in the second direction D2. A slit 275 is arranged between the via conductor V15 and the via conductor V25. A slit 276 is arranged between the via conductor V16 and the via conductor V26.

Also in the high frequency module 1 according to the third embodiment, the interference between the switches 13 and the low noise amplifiers 15 can be reduced. Furthermore, since the switches 13 and the low noise amplifiers 15 do no need to be disposed along one side of the IC chip 10, the size of the IC chip 10 can be reduced.

Fourth Embodiment (1) Configuration

Figure 10:
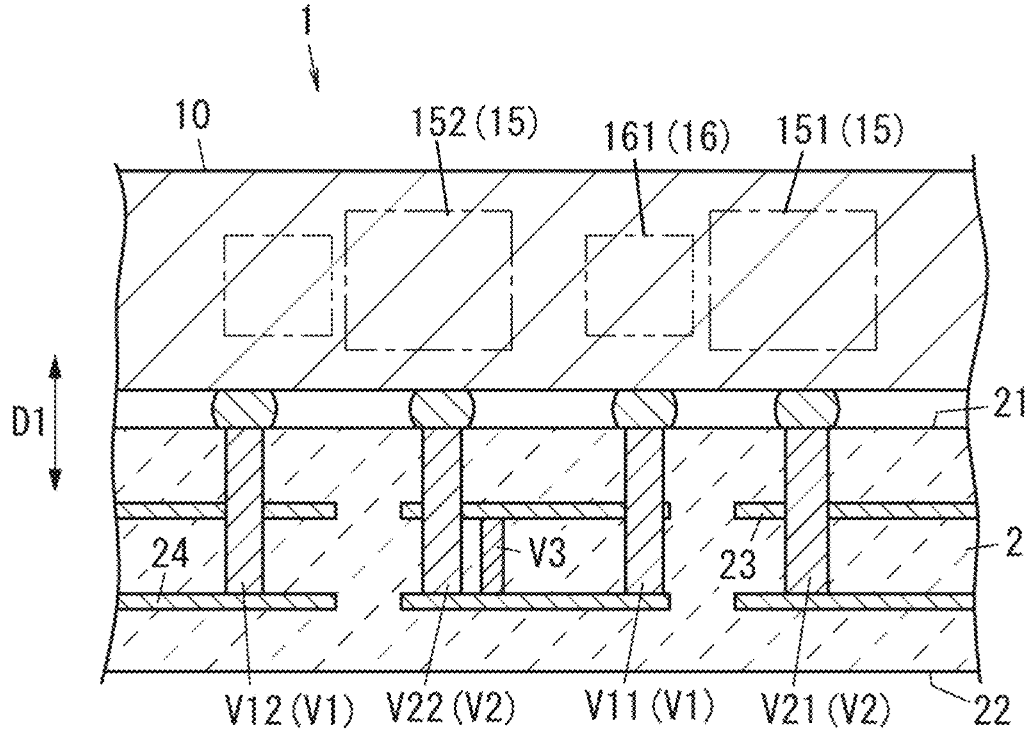
FIG. 10 is a cross-section view of a main part of a high frequency module according to a fourth embodiment.
Figure 11:
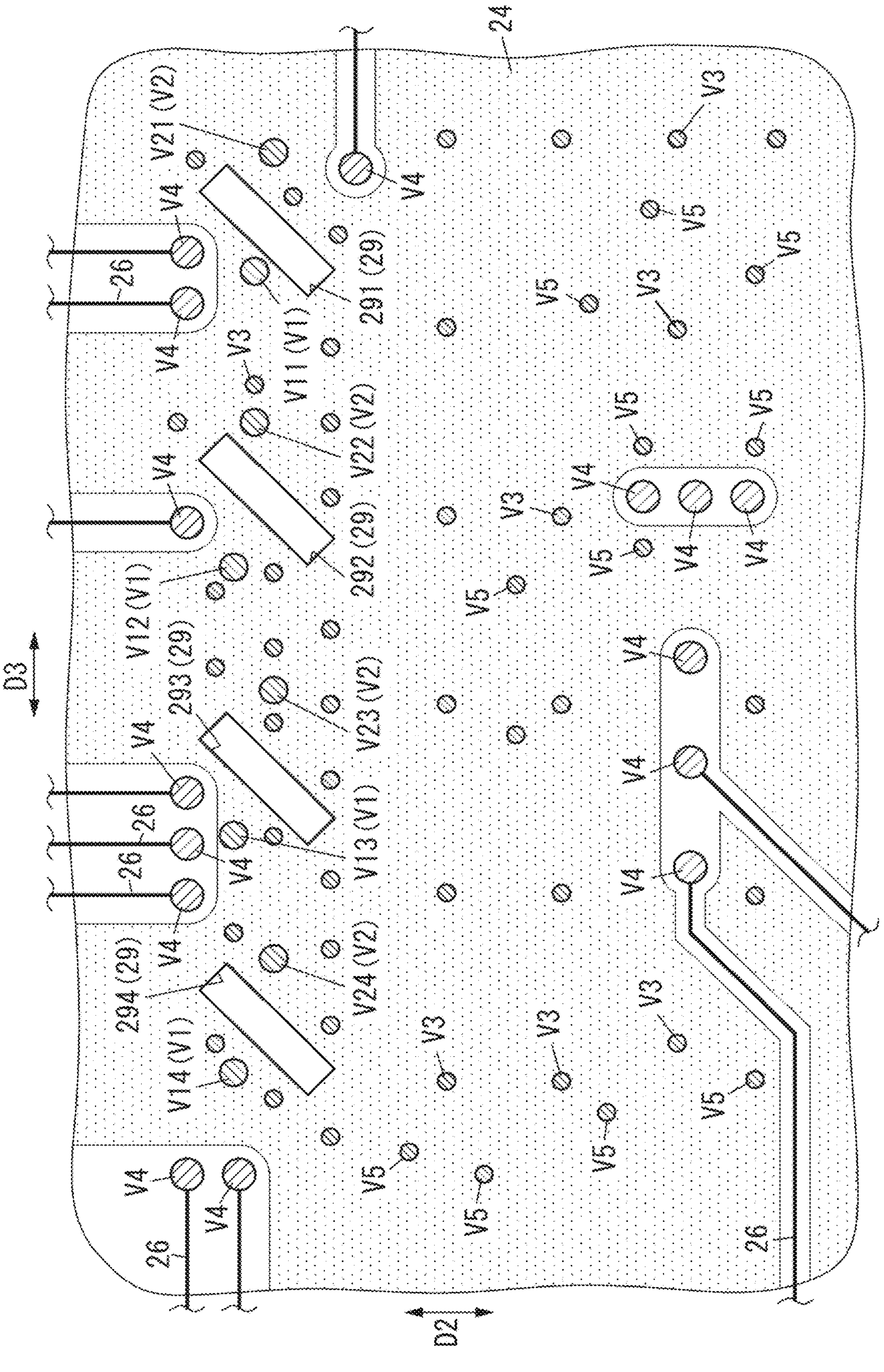
FIG. 11 is a plan view of a second ground layer in the high frequency module.

In a high frequency module 1 according to a fourth embodiment, via conductors included in the first via conductor group and the second via conductor group penetrate through the first ground layer 23 and reach the second ground layer 24, as illustrated in FIGS. 10 and 11.

Specifically, as illustrated in FIGS. 10 and 11, the first via conductor group and the second via conductor group penetrate through the first ground layer 23 and connect the first main surface 21 of the mounting substrate 2 to the second ground layer 24. The first via conductor group and the second via conductor group are connected to the first ground layer 23. In other words, the first via conductor group and the second via conductor group connect the first ground layer 23 to the second ground layer 24. Thus, uniformity of the potential of the first ground layer 23 is improved. All the via conductors V1 and V2 included in the first via conductor group and the second via conductor group are not necessarily connected to the second ground layer 24. Only at least one via conductor V1 and a via conductor V2 corresponding to the via conductor V1 need to be connected to the second ground layer 24.

Furthermore, in the high frequency module 1 according to the fourth embodiment, the second ground layer 24 has a plurality of slits 29. The plurality of slits 29 overlap the plurality of slits 27 in a plan view from the first direction D1. "The plurality of slits 29 overlap the plurality of slits 27 in a plan view from the first direction D1" represents the state in which part of each of the plurality of slits 29 overlap part of any one of the plurality of slits 27 in a plan view from the first direction D1. Specifically, a slit 291 overlaps the slit 271 in a plan view from the first direction D1. A slit 292 overlaps the slit 272 in a plan view from the first direction D1. A slit 293 overlaps the slit 273 in a plan view from the first direction D1. A slit 294 overlaps the slit 274 in a plan view from the first direction D1.

Thus, interference through the second ground layer 24 between the switches 13 connected to the via conductors V1 and the low noise amplifiers 15 connected to the via conductors V2 can be reduced.

(2) Effects

In the high frequency module 1 according to the fourth embodiment, the first via conductor group and the second via conductor group further connect the first ground layer 23 to the second ground layer 24. Thus, the first ground layer 23 is connected to the second ground layer 24 by the first via conductor group and the second via conductor group as well as the third via conductor group. Therefore, the potential of the first ground layer 23 is further stabilized. Furthermore, in the high frequency module 1 according to the fourth embodiment, the second ground layer 24 has the plurality of slits 29. The plurality of slits 27 of the first ground layer 23 and the plurality of slits 29 of the second ground layer 24 overlap in a plan view from the first direction D1. Thus, leakage of a signal through the second ground layer 24 between the plurality of switches 13 and the plurality of low noise amplifiers 15 can be reduced.

Modifications

Although the high frequency modules 1 according to the first to fourth embodiments include the IC chip 10 including the plurality of low noise amplifiers 15, the high frequency modules 1 may include a plurality of IC chips 10. Each of the plurality of IC chips 10 may include the plurality of low noise amplifiers 15 or may include a single low noise amplifier 15. In this case, it is desirable that the plurality of low noise amplifiers 15 be disposed along an outer edge of a region including the plurality of IC chips 10 in a plan view from the first direction D1.

Furthermore, in the high frequency modules 1 according to the first to the third embodiments, one of the plurality of via conductors V1 and the plurality of via conductors V2 may further connect the first ground layer 23 to the second ground layer 24. Thus, the potential of the first ground layer 23 is further stabilized, and leakage of a signal through the first ground layer 23 between the plurality of switches 13 and the plurality of low noise amplifiers 15 is less likely to occur.

Furthermore, in the high frequency modules 1 according to the first to fourth aspects, the mounting substrate 2 may further include a ground layer, in addition to the first ground layer 23 and the second ground layer 24.

Furthermore, although the switch 131 is connected to the reception filters 121 and 122 and the switch 132 is connected to the reception filters 123 and 124 in the high frequency modules 1 according to the first to fourth embodiments, connection relationship between the switches 13 and the reception filters 121 to 124 is not limited to those described above. As long as each of the plurality of switches 13 is configured to select a reception filter to be connected to the low noise amplifier 15 from among a plurality of reception filters, the connection relationship between the switches 13 and the reception filters is configured in a desired manner.

(Aspects)

A high frequency module (1) according to a first aspect includes a mounting substrate (2) and an IC chip (10). The mounting substrate (2) is a multilayer substrate and has a first main surface (21) and a second main surface (22) that are opposite each other. The IC chip (10) is disposed on the first main surface (21) of the mounting substrate (2). The IC chip (10) includes a plurality of switches (13) and a plurality of low noise amplifiers (15). The plurality of low noise amplifiers (15) are connected to the plurality of switches (13) on a one-to-one basis. The plurality of switches (13) include a first switch (131) and a second switch (132). The plurality of low noise amplifiers (15) include a first low noise amplifier (151) and a second low noise amplifier (152). The first low noise amplifier (151) is connected to the first switch (131). The second low noise amplifier (152) is connected to the second switch (132). The mounting substrate (2) includes a first ground layer (23), a second ground layer (24), a first via conductor group, a second via conductor group, and a third via conductor group. The first ground layer (23) is disposed between the first main surface (21) and the second main surface (22). The second ground layer (24) is disposed between the first ground layer (23) and the second main surface (22). The first via conductor group connects the plurality of switches (13) to the first ground layer (23). The second via conductor group connects the plurality of low noise amplifiers (15) to the first ground layer (23). The third via conductor group connects the first ground layer (23) to the second ground layer (24). The first ground layer (23) has a plurality of slits (27; 27*a*). The third via conductor group is disposed around the first via conductor group and the second via conductor group in a plan view from a thickness direction (D1) of the mounting substrate (2). The first via conductor group includes a first via conductor (V11) and a second via conductor (V12). The first via conductor (V11) is connected to the first switch (131). The second via conductor (V12) is connected to the second switch (132). The second via conductor group includes a third via conductor (V21) and a fourth via conductor (V22). The third via conductor (V21) is connected to the first low noise amplifier (151). The fourth via conductor (V22) is connected to the second low noise amplifier (152). The plurality of slits (27; 27*a*) include a first slit (271) and a second slit (272). The first slit (271) is arranged between the first via conductor (V11) and the third via conductor (V21) in a plan view from the thickness direction (D1) of the mounting substrate (2). The second slit (272) is arranged between the second via conductor (V12) and the fourth via conductor (V22) in a plan view from the thickness direction (D1) of the mounting substrate (2). A combination of the first via conductor (V11), the first slit (271), and the third via conductor (V21) and a combination of the second via conductor (V12), the second slit (272), and the fourth via conductor (V22) are arranged adjacent to each other.

With the high frequency module (1) according to the aspect described above, leakage of a signal through the first ground layer (23) between the plurality of switches (13) and the plurality of low noise amplifiers (15) can be reduced. Thus, isolation between each of the plurality of switches (13) and each of the plurality of low noise amplifiers (15) can be improved.

According to a second aspect, in the high frequency module (1) according to the first aspect, the first via conductor group and the second via conductor group connect the first ground layer (23) to the second ground layer (24).

With the high frequency module (1) according to the aspect described above, the potential of the first ground layer (23) is stabilized. Thus, the isolation between each of the plurality of switches (13) and each of the plurality of low noise amplifiers (15) can be improved.

According to a third aspect, in the high frequency module (1) according to the second aspect, the second ground layer (24) has a plurality of slits (29). The plurality of slits (27; 27*a*) of the first ground layer (23) and the plurality of slits (29) of the second ground layer (24) overlap in a plan view from the thickness direction (D1) of the mounting substrate (2).

With the high frequency module (1) according to the aspect described above, leakage of a signal through the second ground layer (24) between the plurality of switches (13) and the plurality of low noise amplifiers (15) can be reduced. Thus, the isolation between each of the plurality of switches (13) and each of the plurality of low noise amplifiers (15) can be improved.

According to a fourth aspect, in the high frequency module (1) according to any one of the first to third aspects, the first via conductor group, the second via conductor group, and the plurality of slits (27) of the first ground layer (23) are arranged in an end portion of the IC chip (10) in a plan view from the thickness direction (D1) of the mounting substrate (2).

With the high frequency module (1) according to the aspect described above, the first via conductor group, the second via conductor group, and the plurality of slits (27) can be arranged in a regular manner. Thus, the same degree of improvement in isolation can be achieved in all the combinations each including a switch (13) and a low noise amplifier (15).

According to a fifth aspect, in the high frequency module (1) according to any one of the first to fourth aspects, the first slit (271) is elongate in a direction that intersects a direction connecting the first via conductor (V11) to the third via conductor (V21) in a plan view from the thickness direction (D1) of the mounting substrate (2). A width of the first slit (271) is less than or equal to a distance between the first via conductor (V11) and the third via conductor (V21) in a plan view from the thickness direction (D1) of the mounting substrate (2).

With the high frequency module (1) according to the aspect described above, the length of a path inside the first ground layer (23) for electrically connecting the first via conductor (V11) to the third via conductor (V21) is sufficiently longer than the distance (d1) between the first via conductor (V11) and the third via conductor (V21). Thus, the interference between the first switch (131) and the first low noise amplifier (151) can further be reduced.

According to a sixth aspect, in the high frequency module (1) according to the fifth aspect, a length (W2) of the first slit (271) is equal to or more than twice the width (W1) of the first slit (271) in a plan view from the thickness direction (D1) of the mounting substrate (2).

With the high frequency module (1) according to the aspect described above, the length of the path inside the first ground layer (23) for electrically connecting the first via conductor (V11) to the third via conductor (V21) is sufficiently longer than the distance (d1) between the first via conductor (V11) and the third via conductor (V21). Thus, the interference between the first switch (131) and the first low noise amplifier (151) can further be reduced.

According to a seventh aspect, in the high frequency module (1) according to any one of the first to fourth aspects, the IC chip (1) further includes a plurality of inductors (16) that are associated with the plurality of low noise amplifiers (15) on a one-to-one basis. Each of the plurality of inductors (16) is connected between a corresponding low noise amplifier (15) out of the plurality of low noise amplifiers (15) and a via conductor (V2) that is connected to the corresponding low noise amplifier (15) in the second via conductor group. One of the plurality of inductors (16) overlaps the first slit (27*a*) in a plan view from the thickness direction (D1) of the mounting substrate (2).

With the high frequency module (1) according to the aspect described above, electromagnetic coupling between each of the plurality of inductors (16) and the first ground layer (23) can be reduced, and inflow of noise to the plurality of low noise amplifiers (15) can be reduced. Furthermore, since the length of the path inside the first ground layer (23) for electrically connecting the via conductor (V1) to the via conductor (V2) is further increased, the interference between the switches (13) and the low noise amplifiers (15) can further be reduced.

According to an eighth aspect, in the high frequency module (1) according to any one of the first to seventh aspects, a plurality of via conductors (V1) included in the first via conductor group are associated with a plurality of via conductors (V2) included in the second via conductor group on a one-to-one basis. One of the plurality of slits (27; 27*a*) is arranged between each of the plurality of via conductors (V1) included in the first via conductor group and a corresponding via conductor (V2) of the second via conductor group.

With the high frequency module (1) according to the aspect described above, the isolation between each of all the plurality of switches (13) and a corresponding connected low noise amplifier (15) can be improved.

A communication apparatus (100) according to a ninth aspect includes the high frequency module (1) according to any one of the first to eighth aspects; and a signal processing circuit (19) that is connected to the high frequency module (1).

With the communication apparatus (100) according to the aspect described above, leakage of a signal through the first ground layer (23) between the plurality of switches (13) and the plurality of low noise amplifiers (15) can be reduced in the high frequency module (1). Thus, the isolation between each of the plurality of switches (13) and each of the plurality of low noise amplifiers (15) can be improved.

What is claimed is:

1. A high frequency module comprising:
- a multilayer mounting substrate having a first main surface and a second main surface that are opposite each other; and
- an integrated circuit (IC) chip that is on the first main surface of the multilayer mounting substrate,
- wherein the IC chip comprises:
  - a plurality of switches, and
  - a plurality of low noise amplifiers that are connected to the plurality of switches on a one-to-one basis,
- wherein the plurality of switches comprises a first switch and a second switch,
- wherein the plurality of low noise amplifiers comprises:
  - a first low noise amplifier that is connected to the first switch, and
  - a second low noise amplifier that is connected to the second switch,
- wherein the multilayer mounting substrate comprises:
  - a first ground layer that is between the first main surface and the second main surface in a thickness direction of the multilayer mounting substrate,
  - a second ground layer that is between the first ground layer and the second main surface in the thickness direction of the multilayer mounting substrate,
  - a first via conductor group that connects the plurality of switches to the first ground layer,
  - a second via conductor group that connects the plurality of low noise amplifiers to the first ground layer, and
  - a third via conductor group that connects the first ground layer to the second ground layer,
- wherein the first ground layer comprises a plurality of slits,
- wherein the third via conductor group is arranged around the first via conductor group and the second via conductor group in a plan view from the thickness direction of the multilayer mounting substrate,
- wherein the first via conductor group comprises:
  - a first via conductor that is connected to the first switch, and
  - a second via conductor that is connected to the second switch,
- wherein the second via conductor group comprises:
  - a third via conductor that is connected to the first low noise amplifier, and
  - a fourth via conductor that is connected to the second low noise amplifier,
- wherein the plurality of slits comprises:
  - a first slit that is arranged between the first via conductor and the third via conductor in the plan view, and
  - a second slit that is arranged between the second via conductor and the fourth via conductor in the plan view, and
- wherein a first combination of the first via conductor, the first slit, and the third via conductor is adjacent to a second combination of the second via conductor, the second slit, and the fourth via conductor.

2. The high frequency module according to claim 1, wherein the first via conductor group and the second via conductor group connect the first ground layer to the second ground layer.

3. The high frequency module according to claim 2,
- wherein the second ground layer comprises a plurality of slits, and
- wherein the plurality of slits of the first ground layer and the plurality of slits of the second ground layer overlap in the plan view.

4. The high frequency module according to claim 1, wherein the first via conductor group, the second via conductor group, and the plurality of slits of the first ground layer are arranged at an end of the IC chip in the plan view.

5. The high frequency module according to claim 1, wherein in the plan view:
- the first slit is elongated in a first direction that intersects a second direction connecting the first via conductor to the third via conductor, and
- a width of the first slit is less than or equal to a distance between the first via conductor and the third via conductor.

6. The high frequency module according to claim 5, wherein a length of the first slit is equal to or greater than twice the width of the first slit in the plan view.

7. The high frequency module according to claim 1, wherein the IC chip further comprises a plurality of inductors that are connected to the plurality of low noise amplifiers on a one-to-one basis, wherein each of the plurality of inductors is connected between a corresponding low noise amplifier and a via conductor that is connected to the corresponding low noise amplifier in the second via conductor group, and wherein one of the plurality of inductors overlaps the first slit in the plan view.

8. The high frequency module according to claim 1, wherein one of the plurality of slits is arranged between each of the plurality of via conductors of the first via conductor group and a corresponding via conductor of the second via conductor group.

9. A communication apparatus comprising:

the high frequency module according to claim 1; and a signal processing circuit that is connected to the high frequency module.

10. The high frequency module according to claim 2, wherein the first via conductor group, the second via conductor group, and the plurality of slits of the first ground layer are arranged at an end of the IC chip in the plan view.

11. The high frequency module according to claim 3, wherein the first via conductor group, the second via conductor group, and the plurality of slits of the first ground layer are arranged at an end of the IC chip in the plan view.

12. The high frequency module according to claim 2, wherein in the plan view:

the first slit is elongated in a first direction that intersects a second direction connecting the first via conductor to the third via conductor, and a width of the first slit is less than or equal to a distance between the first via conductor and the third via conductor.

13. The high frequency module according to claim 3, wherein in the plan view:

the first slit is elongated in a first direction that intersects a second direction connecting the first via conductor to the third via conductor, and a width of the first slit is less than or equal to a distance between the first via conductor and the third via conductor.

14. The high frequency module according to claim 2, wherein the IC chip further comprises a plurality of inductors that are connected to the plurality of low noise amplifiers on a one-to-one basis, wherein each of the plurality of inductors is connected between a corresponding low noise amplifier and a via conductor that is connected to the corresponding low noise amplifier in the second via conductor group, and wherein one of the plurality of inductors overlaps the first slit in the plan view.

15. The high frequency module according to claim 3, wherein the IC chip further comprises a plurality of inductors that are connected to the plurality of low noise amplifiers on a one-to-one basis, wherein each of the plurality of inductors is connected between a corresponding low noise amplifier and a via conductor that is connected to the corresponding low noise amplifier in the second via conductor group, and wherein one of the plurality of inductors overlaps the first slit in the plan view.

16. The high frequency module according to claim 2, wherein one of the plurality of slits is arranged between each of the plurality of via conductors of the first via conductor group and a corresponding via conductor of the second via conductor group.

17. The high frequency module according to claim 3, wherein one of the plurality of slits is arranged between each of the plurality of via conductors of the first via conductor group and a corresponding via conductor of the second via conductor group.

* * * * *